US012796365B2

(12) United States Patent
Hsiao et al.

(10) Patent No.: US 12,796,365 B2
(45) Date of Patent: Nov. 10, 2026

(54) LANDING METAL ETCH PROCESS FOR IMPROVED OVERLAY CONTROL

(71) Applicant: Taiwan Semiconductor Manufacturing Company, Ltd., Hsinchu (TW)

(72) Inventors: Chih-Min Hsiao, Hsinchu (TW); Chih-Ming Lai, Hsinchu (TW); Chien-Wen Lai, Hsinchu (TW); Ya Hui Chang, Hsinchu (TW); Ru-Gun Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 214 days.

(21) Appl. No.: 18/778,571

(22) Filed: Jul. 19, 2024

(65) Prior Publication Data

US 2024/0371653 A1 Nov. 7, 2024

Related U.S. Application Data

(60) Continuation of application No. 18/227,858, filed on Jul. 28, 2023, now Pat. No. 12,125,712, which is a continuation of application No. 17/735,073, filed on May 2, 2022, now Pat. No. 11,798,812, which is a division of application No. 16/688,681, filed on Nov. 19, 2019, now Pat. No. 11,322,362.

(Continued)

(51) Int. Cl.

| | |
|---|---|
| ***H10P 50/00*** | (2026.01) |
| ***H10W 20/00*** | (2026.01) |
| ***H10W 20/42*** | (2026.01) |
| ***H10W 20/43*** | (2026.01) |

(52) U.S. Cl.

CPC ........... *H10P 50/73* (2026.01); *H10W 20/056* (2026.01); *H10W 20/085* (2026.01); *H10W 20/42* (2026.01); *H10W 20/43* (2026.01)

(58) Field of Classification Search

CPC ......... H01L 21/76805; H01L 21/76814; H01L 21/76877; H01L 27/127

See application file for complete search history.

(56) References Cited

U.S. PATENT DOCUMENTS

| | | | |
|---|---|---|---|
| 6,689,695 | B1 | 2/2004 | Lui et al. |
| 11,322,362 | B2 | 5/2022 | Hsiao et al. |

OTHER PUBLICATIONS

Notice of Allowance issued in U.S. Appl. No. 16/688,681 dated Dec. 27, 2021.

(Continued)

*Primary Examiner* — Robert G Bachner
(74) *Attorney, Agent, or Firm* — STUDEBAKER BRACKETT PLLC

(57) ABSTRACT

A method for manufacturing a semiconductor device includes depositing a hard mask layer on an upper surface of an insulating layer. The hard mask layer is etched to form an opening in the hard mask layer. A via recess is formed in the insulating layer through the opening. A first photoresist layer is formed on the hard mask layer and in the via recess. The first photoresist layer is etched to form a photoresist plug in the via recess. Two opposite sides of the opening are etched to remove portions of the hard mask layer and thereby a portion of the upper surface of the insulating layer is exposed. The photoresist plug is removed. Metal is deposited in the via recess and on the exposed surface of the insulating layer. The metal is patterned.

20 Claims, 20 Drawing Sheets

Related U.S. Application Data

(60) Provisional application No. 62/774,125, filed on Nov. 30, 2018.

(56) References Cited

OTHER PUBLICATIONS

Notice of Allowance issued in U.S. Appl. No. 17/735,073, dated Jun. 28, 2023.
Non-Final Office Action issued in U.S. Appl. No. 18/227,858, dated Mar. 1, 2024.
Notice of Allowance issued in U.S. Appl. No. 18/227,858, dated Jun. 24, 2024.

LANDING METAL ETCH PROCESS FOR IMPROVED OVERLAY CONTROL

CROSS-REFERENCE TO RELATED APPLICATIONS

This application is a continuation application of U.S. patent application Ser. No. 18/227,858, filed on Jul. 28, 2023, which is a continuation application of U.S. patent application Ser. No. 17/735,073, filed May 2, 2022, now U.S. Pat. No. 11,798,812, which is a divisional application of U.S. patent application Ser. No. 16/688,681, filed Nov. 19, 2019, now U.S. Pat. No. 11,322,362, which claims priority to U.S. Provisional Patent Application No. 62/774,125, filed Nov. 30, 2018, the entire contents of each these applications are incorporated herein by reference.

BACKGROUND

In forming a via and a metal wiring during semiconductor device fabrication, improved overlay control is desired when performing metal etching for patterning the metal. Overlay control is particularly important since dimensions of the metal line and via hole are reduced in newer device fabrication techniques, and overlay control is more difficult to achieve due to the reduced dimensions.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1B:
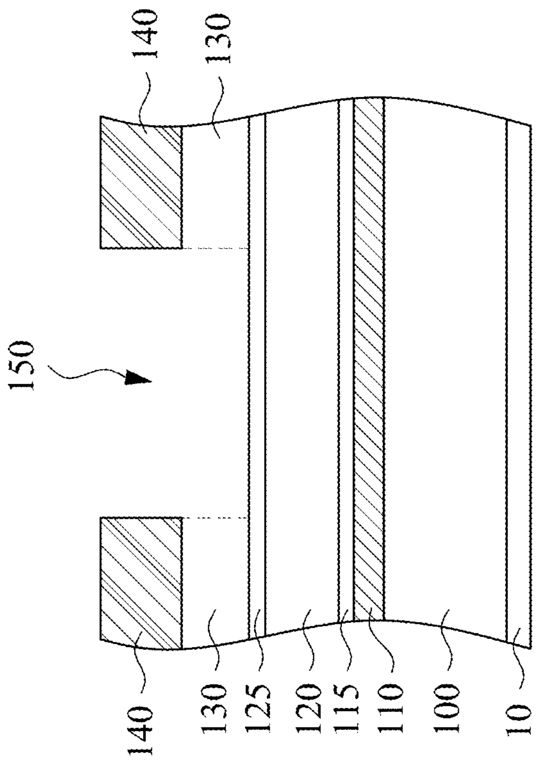
FIGS. 1A-1D illustrate a process of forming metal interconnects.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Embodiments of the disclosure are directed to reducing the overlay errors, and thereby reducing the formation of pits/voids in a metal line or vias when etching the metal line in a dual damascene process.

The term 'damascene', in the context of integrated circuits, implies a patterned layer embedded on and in another layer such that the top surfaces of the two layers are coplanar. Thus, in semiconductor manufacturing, trenches and holes in appropriate locations in the trenches are formed in an insulating material by etching, which are then filled with metal. Metal in trenches forms the horizontal metal line interconnects while the metal in the underlying vias form the vertical connections to the layers of metal interconnects formed in the previous damascene structure.

Thus, in a single damascene semiconductor manufacturing process, incisions, or trenches, are formed in an insulating layer and filled with metal to form conductive lines. Dual damascene (DD) takes the process one step further in that, in addition to forming the trenches of a single damascene, vias are also formed at appropriate places in the trench further into the insulating layer. The resulting composite structure of trenches and vias are filled with metal.

The process is repeated as many times as required to form the multi-level interconnections between metal lines and the vias formed therebetween.

Figure 1A:
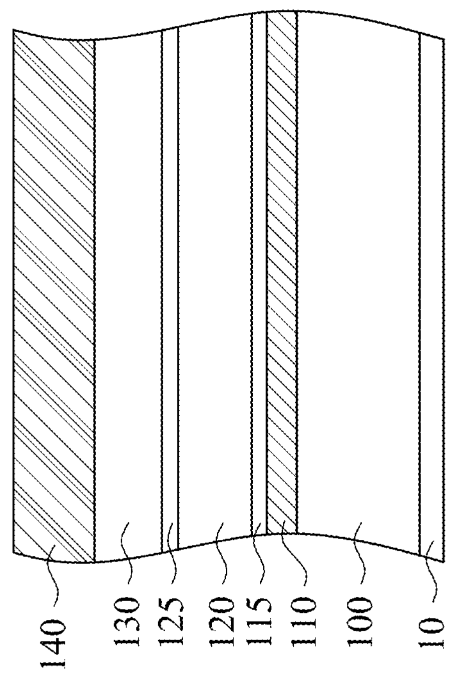

FIGS. 1A-1D illustrate a process of forming metal interconnects. As shown in FIG. 1A, first and second insulating layers 120 and 130 are formed over a layer 100 which is formed over a substrate 10. The second insulating layer 130 is deposited over the first insulating layer 120. The first insulating layer 120 is an inter-layer dielectric layer and the second insulating layer 130 is an inter-metal dielectric layer in some embodiments. An intervening etch-stop or trench-stop layer 125, such as silicon nitride, is disposed between the first and second insulating layers 120 and 130 in some embodiments. The substrate 100 is provided with a metal layer 110 on an upper surface thereof and another etch-stop layer or via-stop layer 115 is formed on the metal layer 110 in some embodiments. The metal layer includes aluminum and/or copper, while the via-stop layer 115 includes a dielectric layer, such as silicon nitride. A first photoresist layer 140 is formed over the upper insulating layer 130.

Figure 1C:
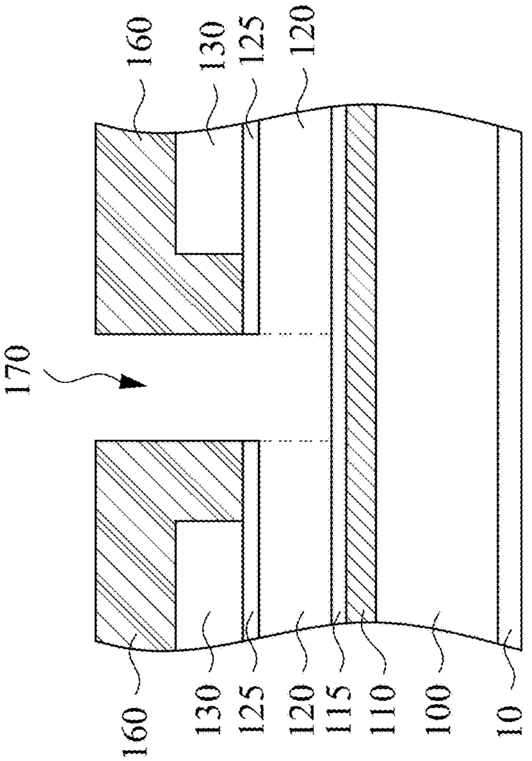
Figure 1D:
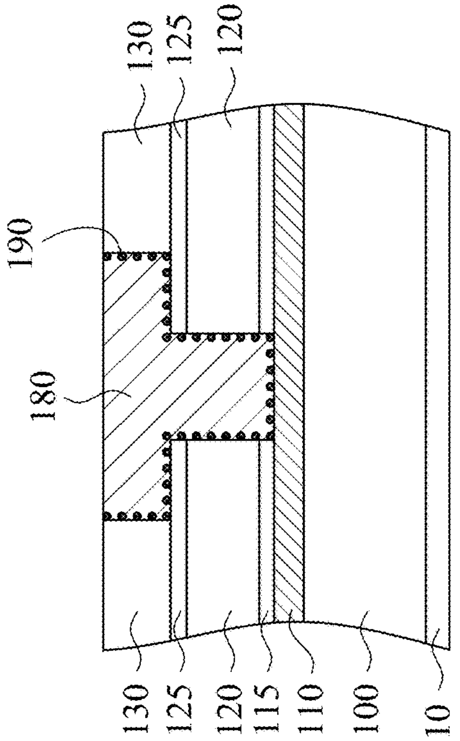

As illustrated in FIG. 1B, a desired trench or trench pattern 150 is first formed into the upper insulating layer 130 using photolithographic and etching methods. The trench-stop layer 125 limits etching of the layers below the trench-stop layer 125. For example, the trench-stop layer 125 limits the etching of the first insulating layer 120, the via-stop layer 115, the metal layer 110, and the substrate 100. The first photoresist layer 140 is removed and a second photoresist layer 160 is formed over the substrate 100, thus filling the trench opening 150. The second photoresist layer 160 is patterned to form a via hole 170, as shown in FIG. 1C. The hole pattern is then extended into the etch-stop layer 125 and etched into the first insulating layer 120. The second photoresist layer 160 is removed. The via-stop layer 115 limits the etching of the metal layer 110 and the substrate 100.

The via-stop layer 115 at the bottom of the via hole 170 is removed before metal 180 is deposited. A seed layer 190 is formed on the sidewalls of the trench 150 and the opening 150 before depositing metal 180 to fill the via hole and trench opening. The seed layer 190 includes the metal included in the metal 180 filling the via hole and trench opening. Thus, both the via hole 170 and trench opening 150 are filled with metal 180, and any excess material on the surface of the substrate is removed by chemical mechanical polishing. The metal 180 in the trench 150 forms the metal interconnects.

In some embodiments, the metal interconnects are formed by patterning the metal 180 using one or more lithography operations and metal etching process. When patterning, the metal 180 in the via hole 170 may be inadvertently etched and pit or voids may be formed in the via hole 170.

Figure 2A:
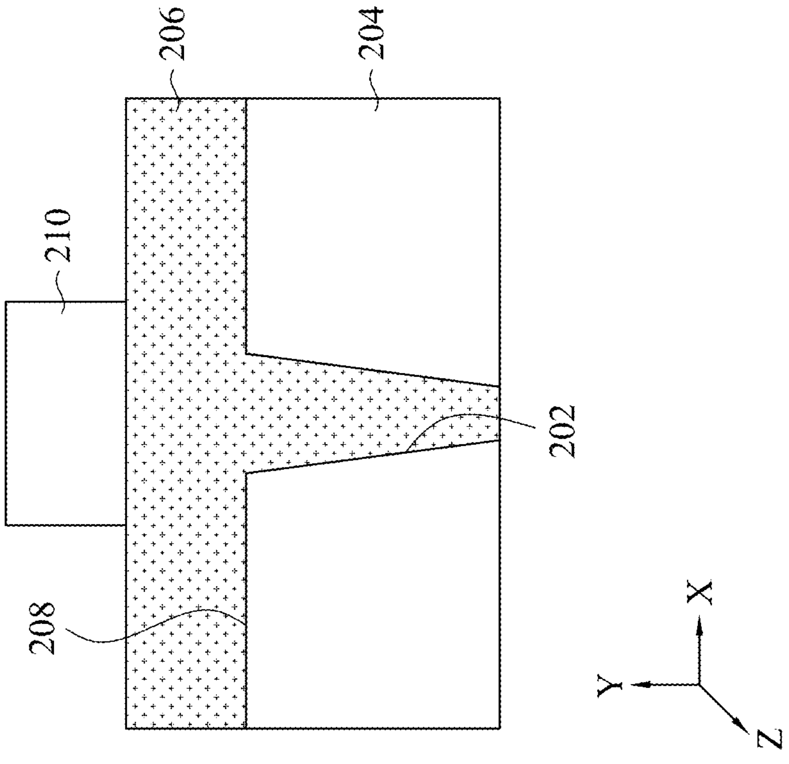
FIG. 2A illustrates a portion of an insulating layer on which a metal etching process is performed with a blocking layer that is aligned with the via.

FIG. 2A illustrates a portion of an insulating layer 204 on which a metal etching process is performed. In an embodiment, the insulating layer 204 is an inter-metal dielectric (IMD) layer. The insulating layer 204 forms at least a portion of a semiconductor substrate, which includes silicon. The semiconductor substrate includes the inter-metal dielectric (IMD) layer 204 formed on a substructure of gates and inter-level dielectric layers (ILD) formed on the semiconductor substrate, in some embodiments. The insulating layer 204 has a low dielectric constant k and is used to electrically insulate adjacent metal lines in an integrated circuit in some embodiments.

Figure 2B:
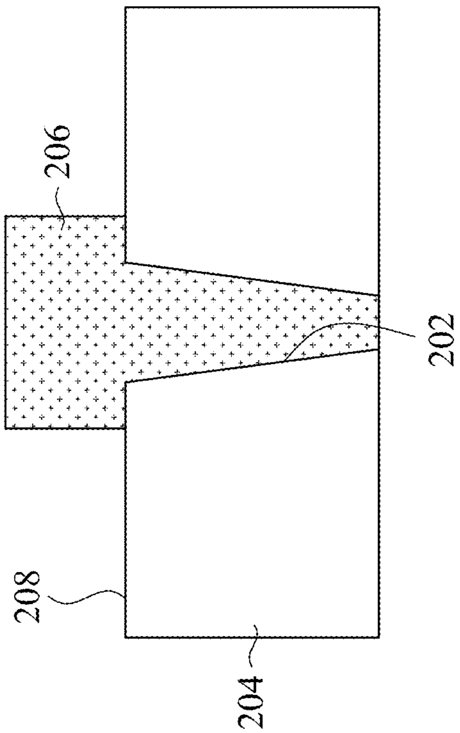
FIG. 2B illustrates a result of the metal etching process of FIG. 2A.

As illustrated, a via hole (also referred to as a via recess, or simply, via) 202 is formed in the insulating layer 204 and a metal 206 is deposited in the via 202 and on the surface 208 of the insulating layer 204. In order to pattern the metal layer 206, a lithography blocking layer 210 (e.g., a mask) is deposited on the metal layer 206 and over the via 102. The lithography blocking layer 210 is aligned (or otherwise overlapped) over the via 202 such that, during the metal etching process, the metal 206 in the via 202 is not etched, and a desired pattern of the metal layer 206 is obtained, as illustrated in FIG. 2B. The metal etching process is performed using wet etching, dry etching, or plasma etching processes.

Figure 3A:
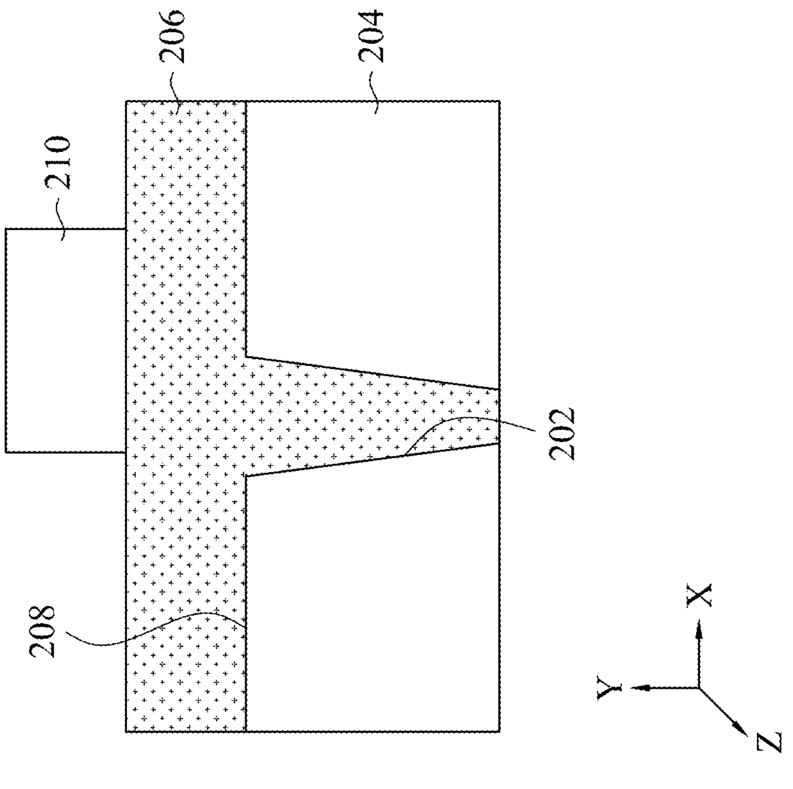
FIG. 3A illustrates a portion of an insulating layer on which a metal etching process is performed with a blocking layer that is offset from the via.
Figure 3B:
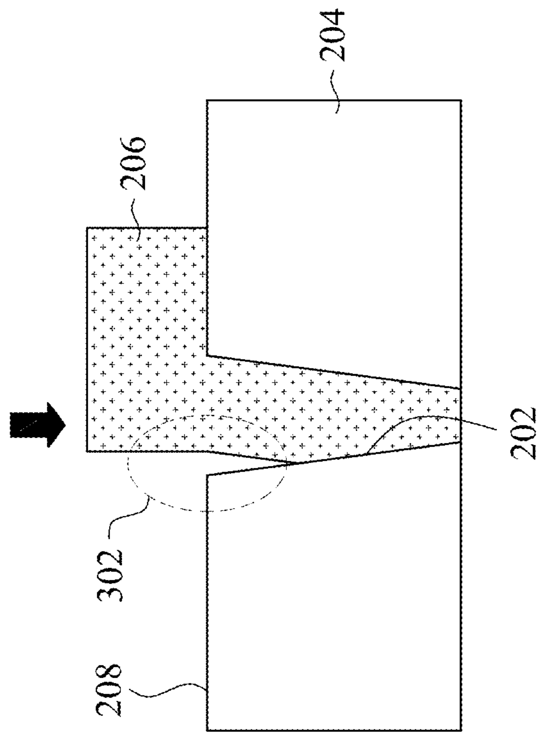
FIG. 3B illustrates a result of the metal etching process of FIG. 3A.

Due to an increase in pattern density and decrease in size of the devices, the error margin in overlay control is reduced and the lithography blocking layer 210 may not correctly align with the via 202. FIG. 3A illustrates an arrangement in which the lithography blocking layer 210 is offset or misaligned from the via 202. Due to the misalignment, when metal etching is performed, pits or voids 302 may be formed due to the removal of the metal 206 from the via 202, as illustrated in FIG. 3B.

Embodiments disclosed herein are directed to using a directional patterning technique to increase the error margin in overlay control and thereby reduce the formation of pits or voids.

FIGS. 4A, 4B, 4C, 4D, 4E, 4G, 4J, 4M, 4N, and 4P illustrate a semiconductor manufacturing process to increase the error margin in overlay control, according to some embodiments. Please note that there is no FIGS. 4I and 4O. It should be noted that processes consistent with the present disclosure may include at least some, but not all of the steps illustrated in FIGS. FIGS. 4A, 4B, 4C, 4D, 4E, 4G, 4J, 4M, 4N, and 4P, performed in a different sequence. Furthermore, processes consistent with the present disclosure may include at least two or more steps performed overlapping in time, or almost simultaneously.

Figure 4A:
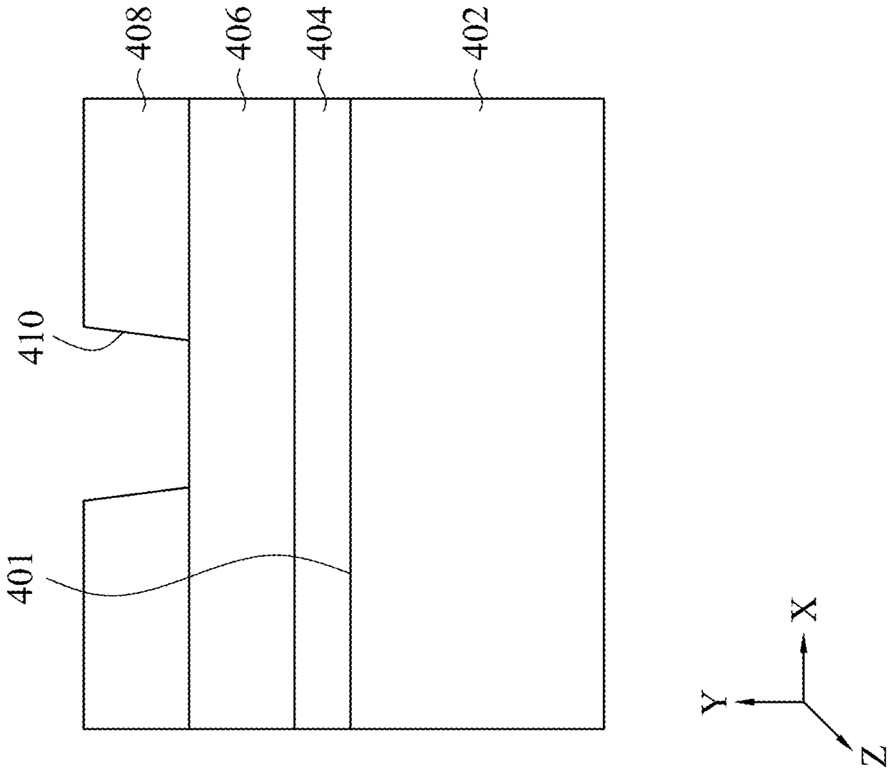
FIGS. 4A, 4B, 4C, 4D, 4E, 4G, 4J, 4M, 4N, and 4P illustrate steps in a semiconductor manufacturing process to increase the error margin in overlay control according to embodiments.

As illustrated in FIG. 4A, a hard mask layer 404, a bottom layer 406, and a photoresist layer 408 are sequentially deposited on an upper surface 401 of an insulating layer 402. In an embodiment, the insulating layer 402 is an inter-metal dielectric (IMD) layer including a low-k dielectric material. The insulating layer 402 electrically insulates adjacent metal lines in an integrated circuit. In an embodiment, the insulating layer 402 includes silicon oxide ($SiO_x$), doped silicon oxide, or silicon dioxide ($SiO_2$). In other embodiments, the low-k materials includes Black Diamond (SiCOH), amorphous fluorinated carbon (α-C:F), poly-tetra-fluoro-ethylene (PTFE), fluorinated polyimide, phosphosilicate glass (PSG). In yet other embodiments, the low-k materials includes benzocyclobutene (BCB), or hydrogen silsesquioxane (HSQ). In some embodiments, the insulating layer 402 includes a combination of an organic low-k material, such as BCB, and FLARE, and a chemical vapor deposited (CVD) oxide called a "hybrid low-k" dielectric. In some embodiments, the hybrid low-k dielectric has a thickness between about 200 nm to about 600 nm (about 2000 Å to about 6000 Å), where a top organic layer has a thickness between about 100 nm to about 500 nm (about 1000 Å to about 5000 Å) and a lower CVD oxide layer has a thickness between about 20 nm to 100 nm (about 200 Å to 1000 Å).

In an embodiment, the hard mask layer 404 includes silicon oxide ($SiO_x$), silicon nitride (SiN), titanium nitride (TiN), or amorphous silicon. The hard mask layer 404 may be formed to a thickness of between about 20 Å and about 3000 Å. In an embodiment, the bottom layer 406 includes silicon oxide, silicon nitride, silicon oxynitride, silicon carbide (SIC), silicon carbonitride (SiCN), silicon oxycarbide (SiOC), silicon oxycarbon nitride (SiOCN), tetraethoxysilane (TEOS) or a combination thereof. The hard mask layer 404 and the bottom layer 406 are made of different materials and are selected so that they have different selectivity to one or more etchants used in the etching process discussed below.

The photoresist layer 408 is patterned using patterning techniques including, for example, electron-beam lithography, deep UV (DUV) or extreme UV (EUV) photolithography, or any other suitable process to form a via pattern 410. The photoresist layer 408 may include a positive tone resist or a negative tone resist. The photoresist layer 408 may include a single layer resist film or multiple layer resist films.

In some embodiments, coating the photoresist layer 408 includes performing a dehydration operation before applying the photoresist layer 408. The dehydration operation enhances the adhesion of the photoresist layer 408 in some embodiments. The dehydration operation may include baking at a high temperature for a duration of time, or applying a chemical such as hexamethyldisilizane (HMDS) to the substrate. Other embodiments also include a soft bake (SB) process to drive solvent out of the photoresist layer 408 and increase the mechanical strength of the photoresist layer 408. An antireflective coating, such as a bottom antireflective coating (BARC) or a top antireflective coating (TARC) is applied below or above the photoresist layer 408 in some embodiments.

Exposing the photoresist layer 408 includes using an optical exposing tool, such as an ArF or KrF laser, EUV radiation, or a charged particle exposing tool, such as an electron beam (e-beam). The optical exposing tool uses a mask in some embodiments. The mask may be a binary mask (BIM), a super binary mask (SBIM), or a phase shift mask (PSM), which includes an alternative phase shift mask (alt. PSM) or an attenuated phase shift mask (att. PSM). Development operations of the exposed photoresist layer 408 includes a post exposure bake (PEB), a post development bake (PDB) process, or a combination thereof in some embodiments.

Figure 4B:
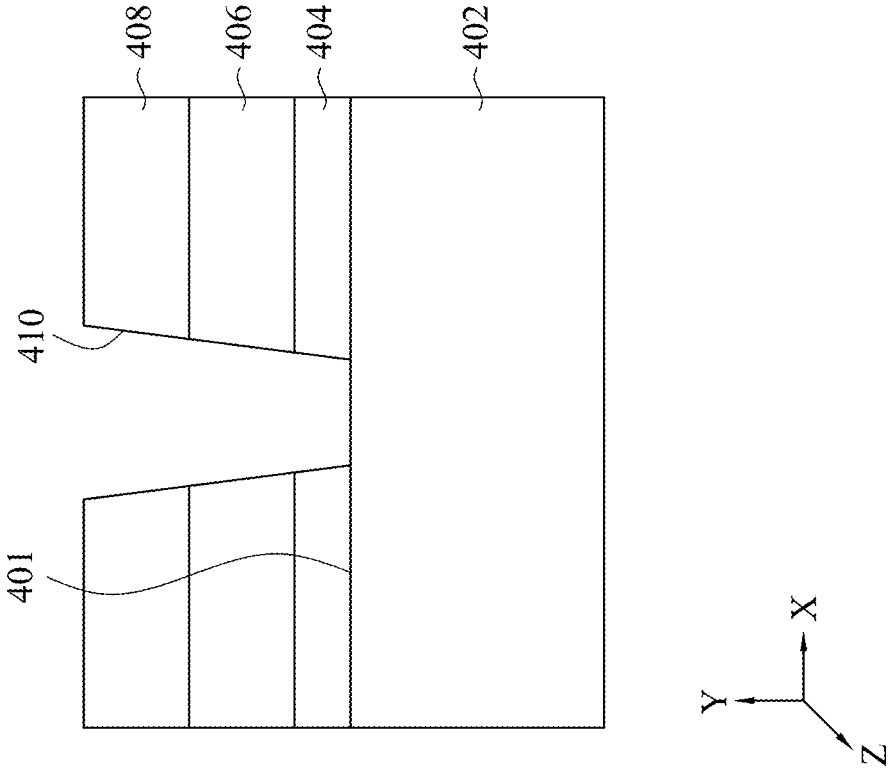

Referring to FIG. 4B, etching operations are performed to remove portions of the bottom layer 406, the hard mask layer 404. Referring to FIG. 4C, further etching operations are performed to remove portions of the insulating layer 402 to form a via 412 into the insulating layer 402 (Y-direction in FIG. 4C) from the upper surface 401 of the insulating layer 402 and an upper surface 403 of the hard mask layer 404. In some embodiments, a dry etching operation is used. The dry etching operation may use an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In other embodiments, the etching operations are performed. In some embodiments, a combination of dry etching techniques and wet etching techniques is used to perform the etching operations.

Still referring to FIG. 4C, the photoresist layer 408 and the bottom layer 406 are removed, and the insulating layer 402 having the via 412 and the hard mask layer 404 on the upper surface 401 of the insulating layer 402 are obtained. As depicted, the edges 407 of the hard mask layer 404 that define an opening 409 in the hard mask layer 404 surrounding the via 412 are aligned (or flush) with the sidewalls of the via 412.

Figure 4D:
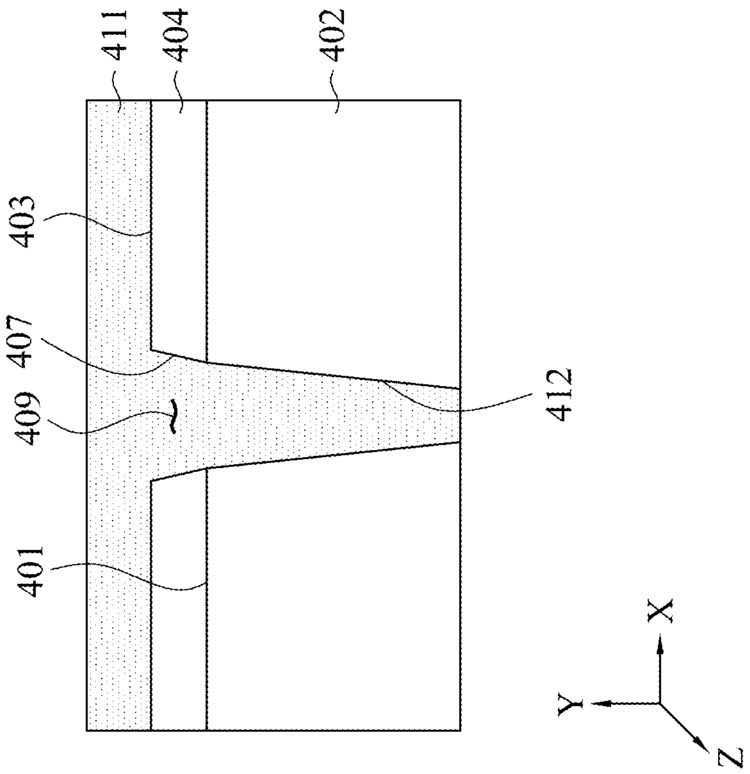
Figure 4C:
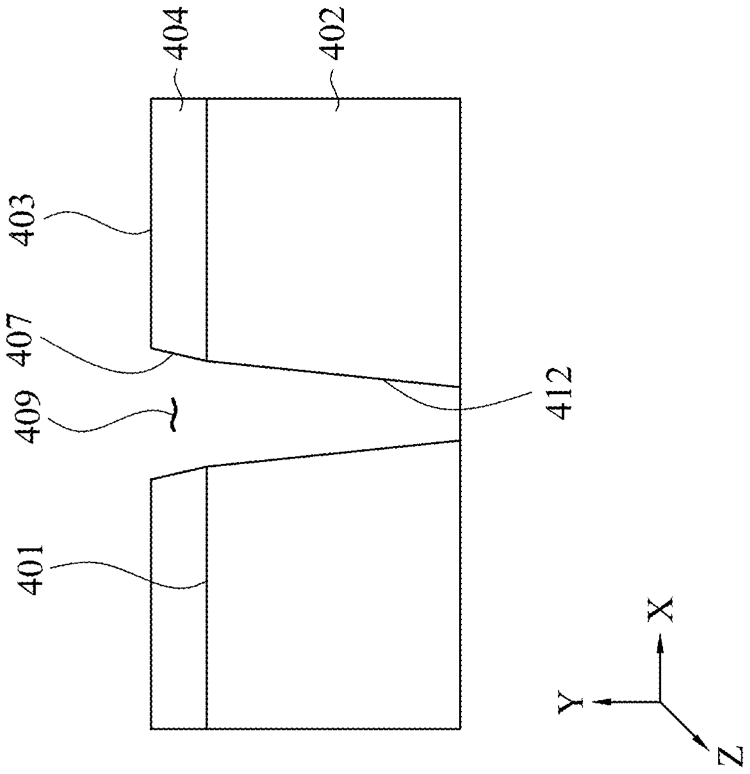

Referring to FIG. 4D, another photoresist 411 is deposited on the upper surface 403 of the hard mask layer 404. The photoresist 411 also fills the via 412.

An etch back process is performed to remove the photoresist 411 off the surface of the hard mask layer 404 and in the opening 409. The photoresist 411 in the via 412 is retained, thereby resulting in a photoresist plug 417, as illustrated in FIG. 4E.

Figure 4E:
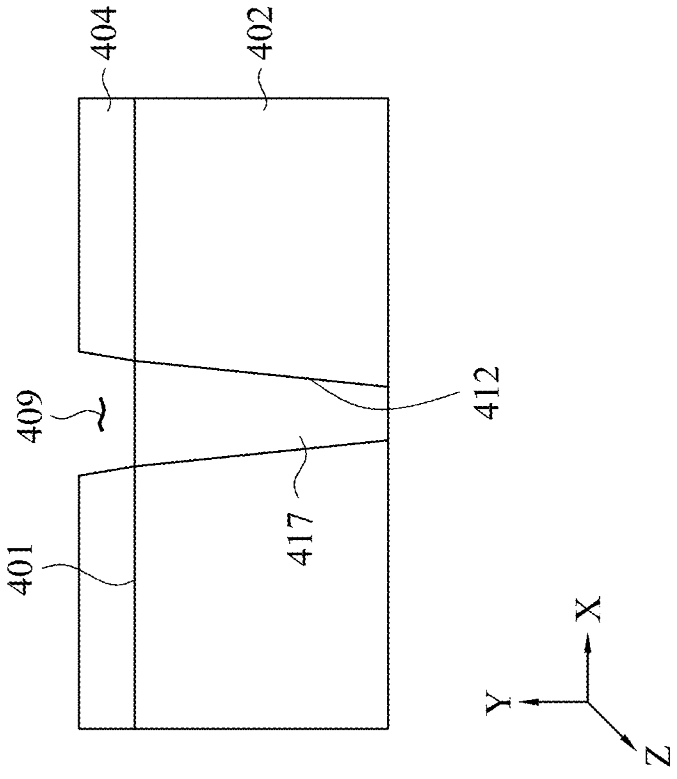
Figure 4F:
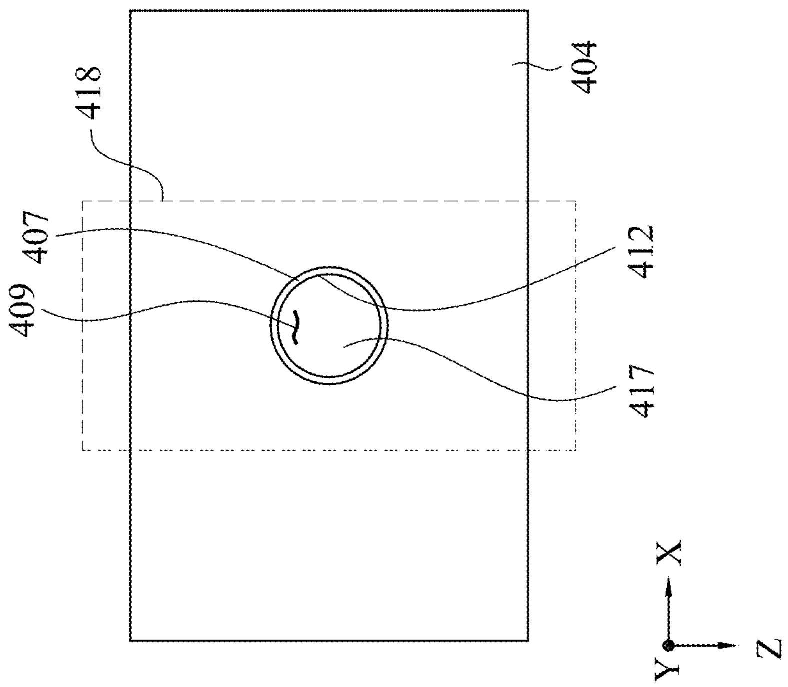
FIG. 4F illustrates a schematic top view of the structure in FIG. 4E.

FIG. 4F illustrates a schematic top view of the structure in FIG. 4E including the via 412. FIG. 4F depicts a desired ideal situation wherein a metal interconnect 418 (illustrated in phantom) covers the entire via 412 and the opening 409 in the hard mask 404, and contacts material deposited in the via 412. In an embodiment, the metal is deposited in the via 412 after removing the photoresist plug 417 from the via 412 (See, FIG. 4P).

However, due to increase in pattern density and decrease in size of the devices, the error margin in overlay control is reduced. As a result, it is challenging to obtain the desired contact illustrated in FIG. 4F. In order to increase the error margin in overlay control, according to embodiments, a directional patterning technique is performed to remove portions of the hard mask layer 404 surrounding the via 412. The hard mask layer 404 is removed to expose the upper surface 401 of the insulating layer 402 surrounding the via 412. By exposing the upper surface 401, a metal landing margin is created, as a result of which, an error margin when patterning of the metal to form a metal interconnect over the via 412 is increased and pit or voids are reduced.

Figure 4H:
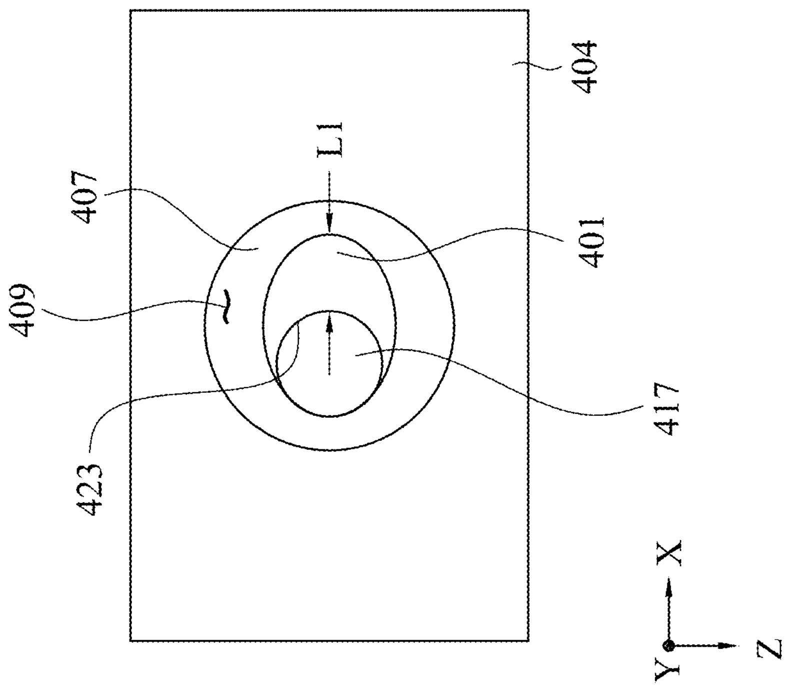
FIGS. 4H and 4K are top views of the structures in FIGS. 4G and 4J, respectively.
Figure 4G:
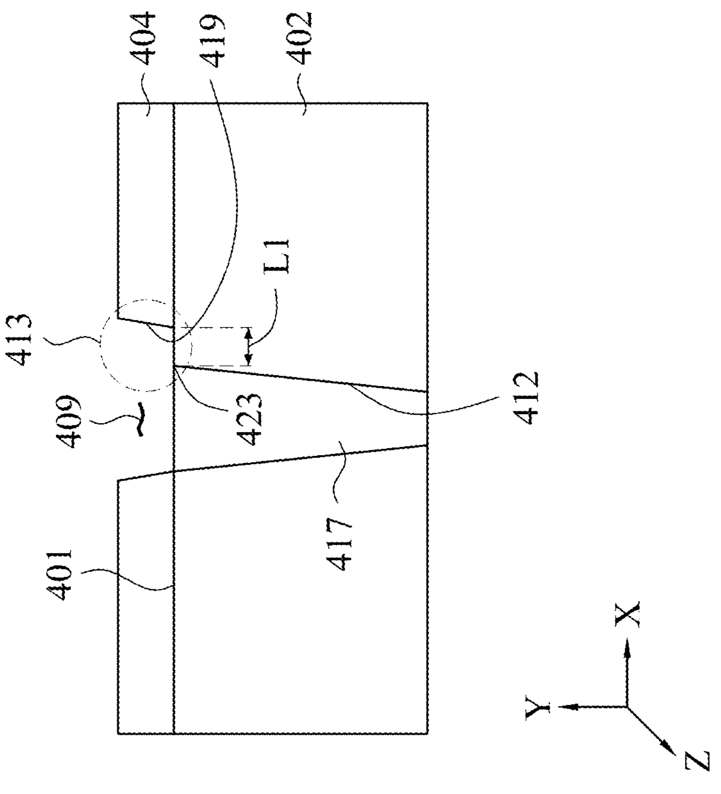
Figure 4J:
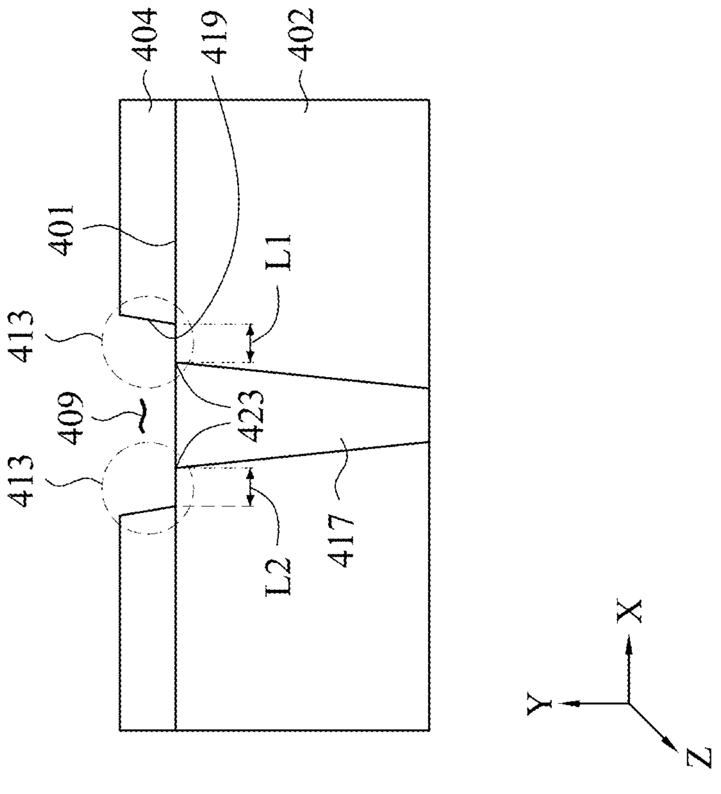

As illustrated in FIGS. 4G and 4J, portions of the hard mask layer 404 that define (or otherwise form) the opening 409 are removed to expose the upper surface 401 of the insulating layer 402 and thereby create a metal landing margin 413. FIGS. 4H and 4K are top views of the structures in FIGS. 4G and 4J, respectively. In an embodiment, directional patterning operations are used to remove portions of the hard mask layer 404 in a direction transverse (or crosswise) to the direction of formation of the via 412. Transverse (or crosswise) as used herein refers to a direction having an angle greater than 0° and less than 180° with reference to the direction of formation of the via 412. Removing the hard mask layer 404 thus widens the opening 409 by removing portions of the hard mask layer 404 around the via 412 in a crosswise direction (with reference to FIGS. 4G, 4H, 4J, 4K) to the via 412.

In an embodiment, and as illustrated in FIG. 4G, a first side of the opening 409 is etched in a first direction (right direction in FIG. 4G) to remove a desired amount of material of the hard mask layer 404. The hard mask layer 404 is removed such that the hard mask layer 404 (or specifically, the sidewalls 419 of the opening 409) is spaced apart from an edge 423 of the via 412 by a distance L1 of about 5 nm to about 10 nm. In other words, about 5 nm to about 10 nm of the upper surface 401 of the insulating layer 402 is exposed from the edge 423 of the via 412. FIG. 4H illustrates a plan view of the structure in FIG. 4G after portions of the hard mask layer 404 have been removed in the first direction.

As illustrated in FIG. 4J, after a desired amount of hard mask layer 404 has been etched, a second side of the opening 409 opposite the first side is etched in a second direction (left direction in FIG. 4J) opposite the first direction to remove a desired amount material of the hard mask layer 404. The hard mask layer 404 is removed such that the hard mask layer 404 is spaced apart from an edge 423 of the via 412 by a distance L2 in the second direction. In an embodiment, the distance L2 is about 5 nm to about 10 nm. Thus, about 5 nm to about 10 nm of the upper surface 401 of the insulating layer 402 is exposed from the edge 423 of the via 412. In some embodiments, the distances L1 and L2 are the same.

However, in other embodiments, the distances L1 and L2 are different. FIG. 4K illustrates a plan view of the structure in FIG. 4J after portions of the hard mask layer 404 have been removed in two opposite directions. The opening 409 when widened is oval in shape, although other shapes are also possible, in other embodiments. It should be noted that dimensions in FIGS. 4G, 4H, 4J, and 4K have been exaggerated for sake of clarity of illustration.

In some embodiments, the distances L1 and L2 are determined based on design rules to avoid undesirable effects. For instance, increasing one or more of the distances L1 and L2 over 10 nm can result in short circuit conditions. The directional patterning operation is used to etch the first side and the second side of the opening 409 sequentially. However, in other embodiments, the first side and the second side of the opening 409 are etched simultaneously or almost simultaneously. The directional patterning operations are not limited to only in the directions discussed above. Other directions are also possible and thus the opening 409 is widened in desired direction.

Figure 4L:
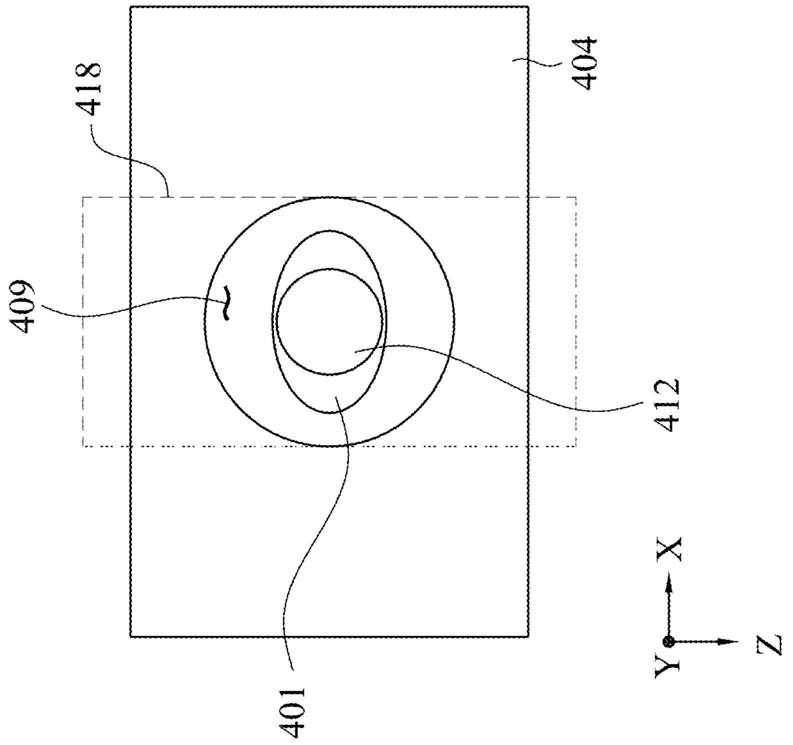
FIG. 4L illustrates a schematic top view of the structure in FIG. 4J.
Figure 4K:
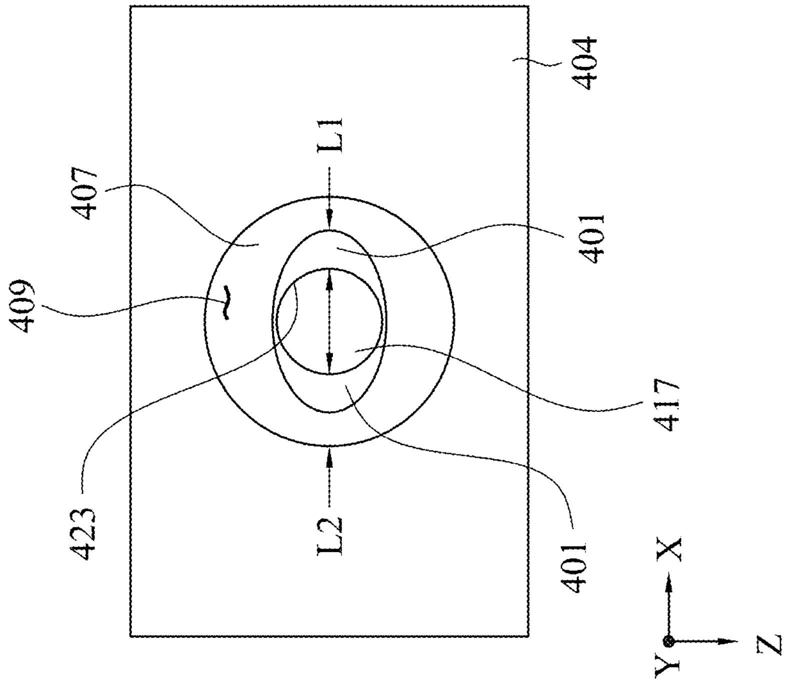

FIG. 4L depicts a situation when metal interconnect 418 (illustrated in phantom) is deposited over the via 412. As shown, the size of the opening 409 in the hard mask layer 404 is greater than in FIG. 4F and a greater surface area is available for a metal interconnect 418 to contact the metal that will be deposited in the via 412. For the sake of explanation, the metal plug 417 is omitted in FIG. 4L.

Figure 4N:
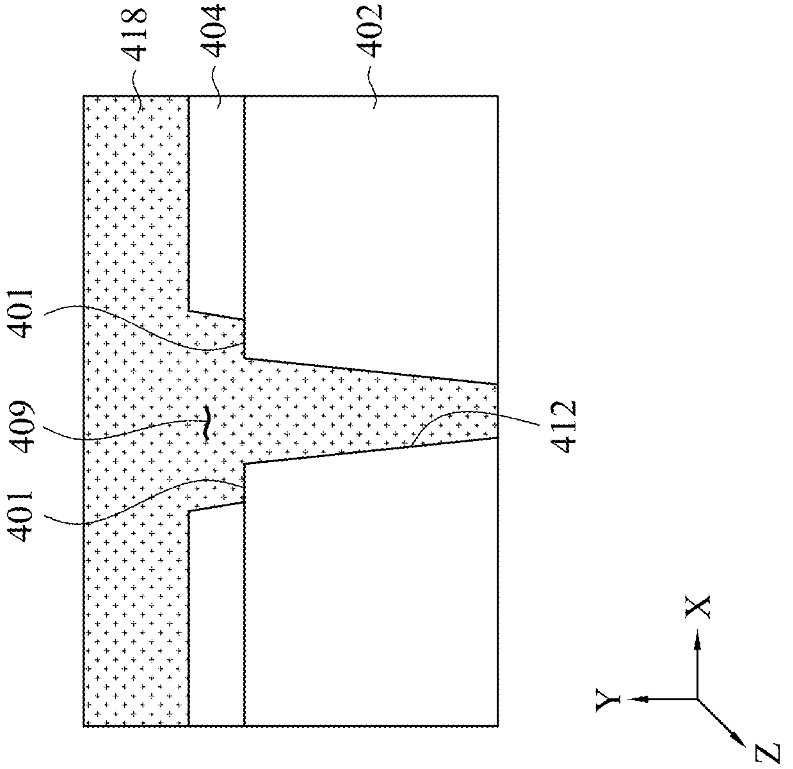
Figure 4M:
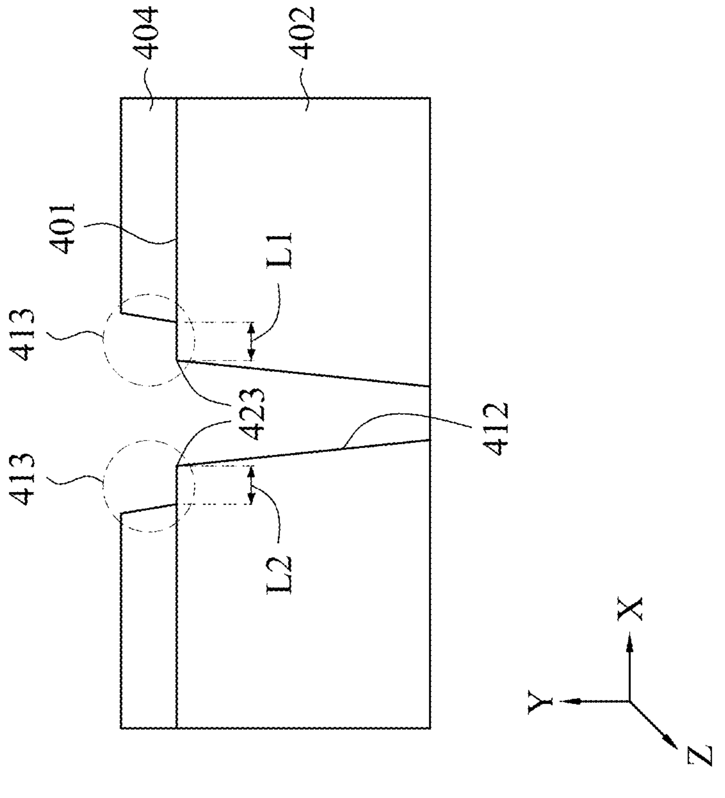

Continuing from FIGS. 4G and 4J, and as illustrated in FIG. 4M, the photoresist plug 417 is removed using a suitable stripping or plasma ashing operation. In some embodiments, a suitable solvent is used to remove the photoresist plug 417. In some other embodiments, the photoresist plug 417 is removed by an oxygen plasma ashing operation.

As illustrated in FIG. 4N, the metal 418 is then deposited in the via 412. The metal 418 also fills the opening 409 in the hard mask 404 and covers the upper surface 401 of the insulating layer 402. The metal 418 in the opening 409 has an oval shape. The metal 418 is also deposited on the hard mask layer 404.

Chemical mechanical polishing (CMP) is performed to planarize the surface of the metal 418. However, in other embodiments, other techniques are used to planarize the surface of the metal 418. The metal 418 is then patterned with a mask and then etched to form metal interconnects. The hard mask layer 404 acts as an etch stop layer to limit the etching of the underlying insulating layer 402. In an embodiment, the metal 418 includes copper or copper alloys. In other embodiments, the metal 418 includes aluminum or tungsten.

Figure 4Q:
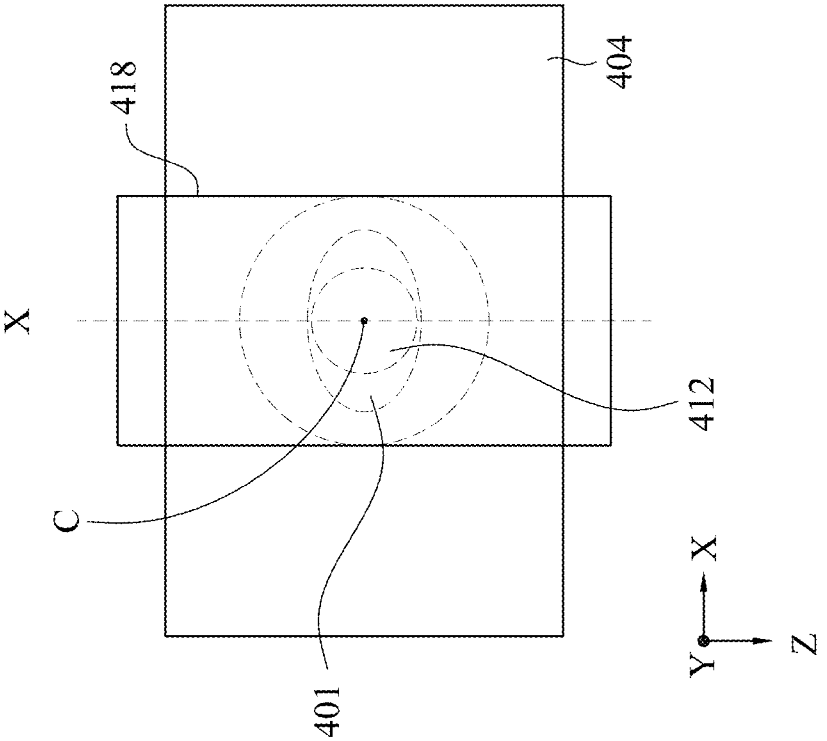
FIG. 4Q illustrates a plan view of the structure in FIG. 4P.
Figure 4P:
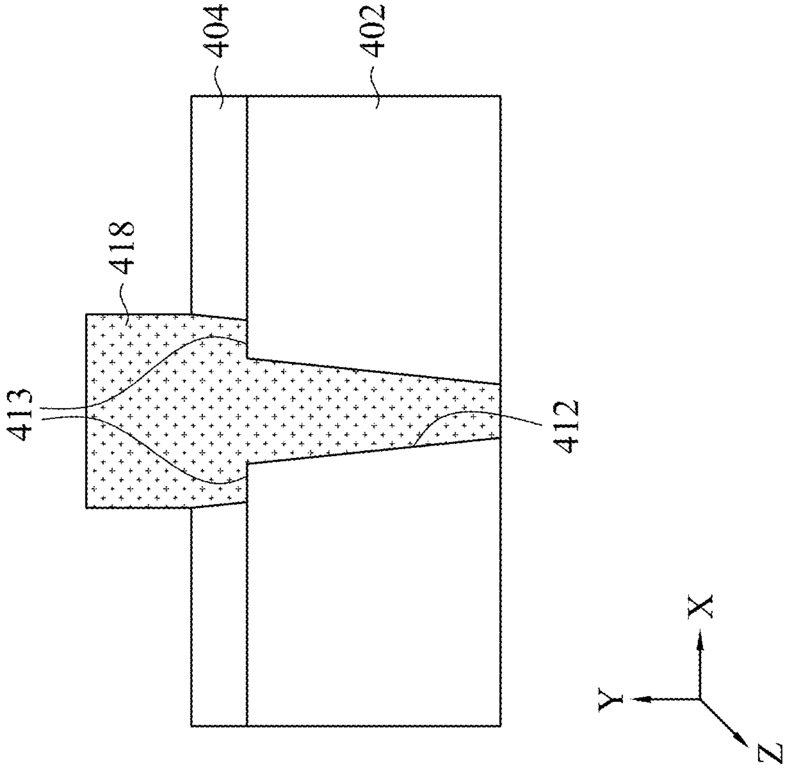

FIG. 4P illustrates a result of an etching operation to etch the metal 418 to form the metal interconnects when the mask is aligned (reduced overlay error) with the via 412. As shown, pits or voids are not observed when the mask is aligned. FIG. 4Q illustrates a plan view of the structure in FIG. 4P. As illustrated, an axis X of the metal interconnect (line) 418 is aligned with the center C of the via 412.

The above process thus increases the surface area of the metal 418 over the insulating layer 402. As discussed below, the increase in the surface area of the metal 418 reduces the occurrence of pits or voids when patterning the metal 418 to form the metal interconnects.

As discussed elsewhere in this document, due to an increase in pattern density and decrease in size of the devices, the error margin in overlay control is reduced and as a result, the mask may not align with the via 412 as desired when performing the metal etching process.

Figure 5B:
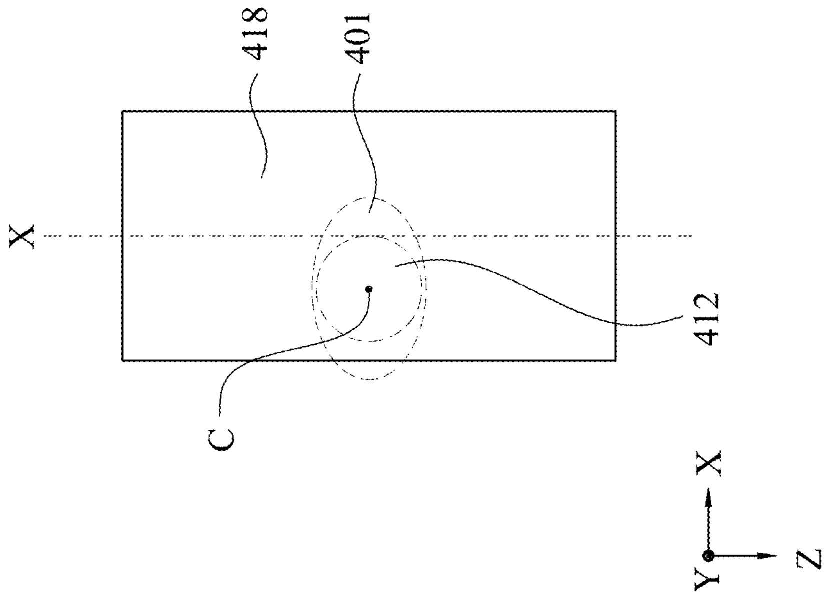
FIG. 5B is a schematic top view of the structure in FIG. 5A.
Figure 5A:
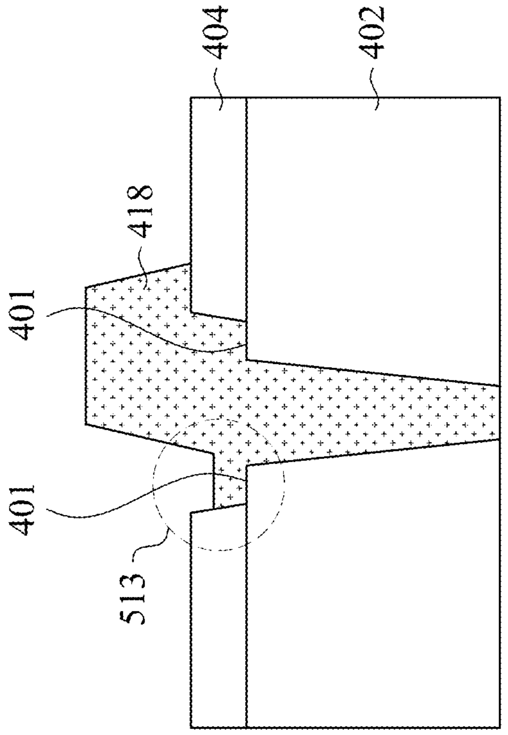
FIG. 5A illustrates a result an etching operation to form metal interconnects when the mask is misaligned with the via.

FIG. 5A illustrates a result of an etching operation to form the metal interconnects when the mask (or similar) is misaligned with the via 412. FIG. 5B is a schematic top view of the structure in FIG. 5A. FIGS. 5A and 5B illustrate a misalignment 513 between the metal interconnect 418 and the via 412. As illustrated in FIG. 5B, the axis X of the metal interconnect (line) 418 is misaligned (offset) from the center C of the via 412. As shown, even though there is misalignment 513, pits or voids are not formed in the via 412 due to the metal landing margin 413 and a desired contact is obtained between the metal interconnect and the metal in the via 412.

Figure 6A:
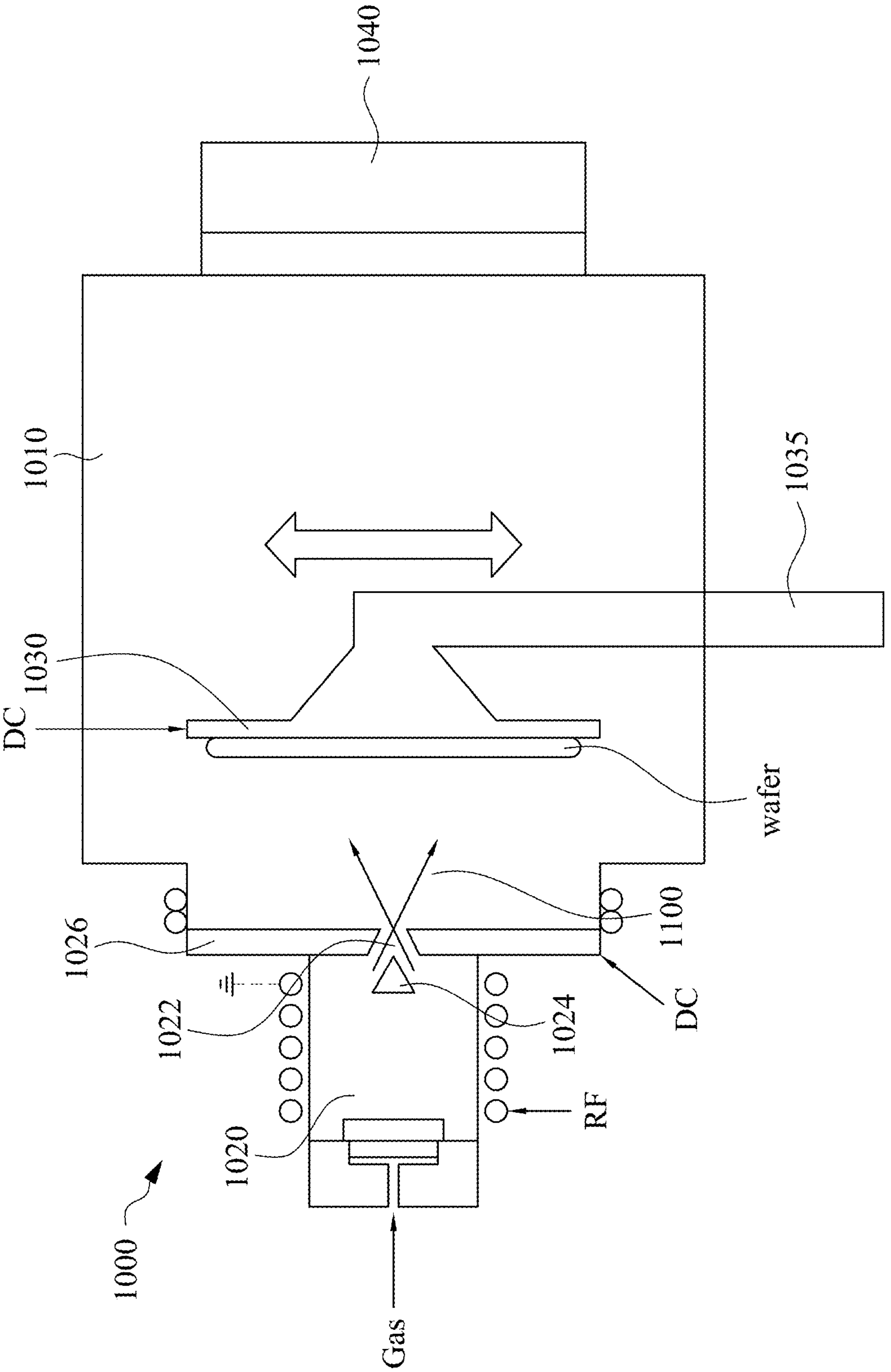
FIG. 6A shows a schematic view of a directional patterning apparatus for performing directional patterning in accordance with an embodiment of the present disclosure.
Figure 6B:
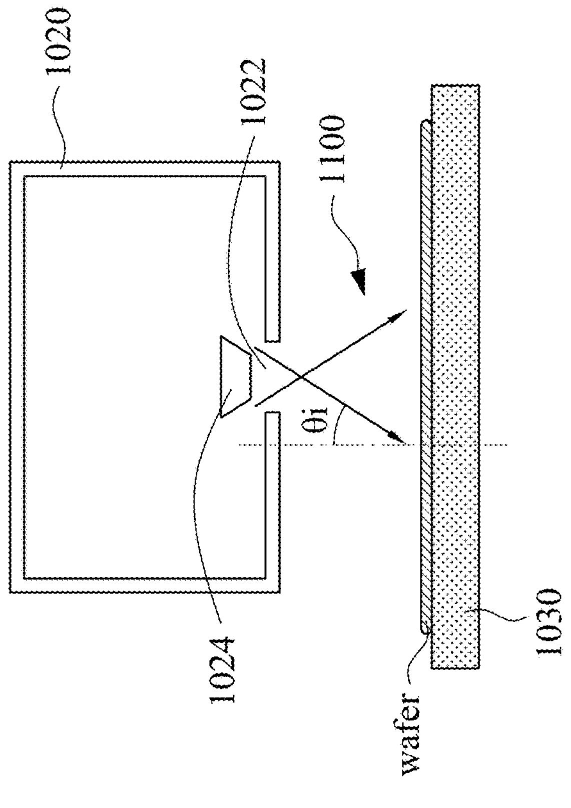
FIGS. 6B, 6C, and 6D show schematic views of a directional patterning process.
Figure 6C:
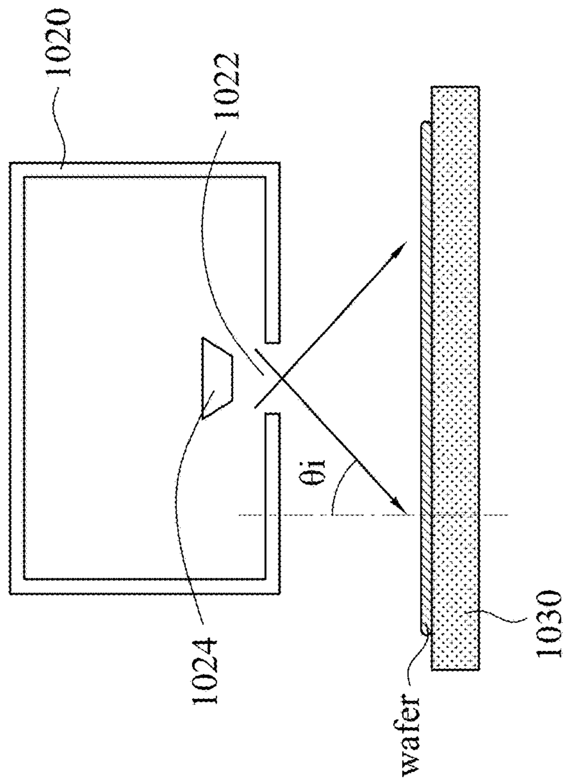
Figure 6D:
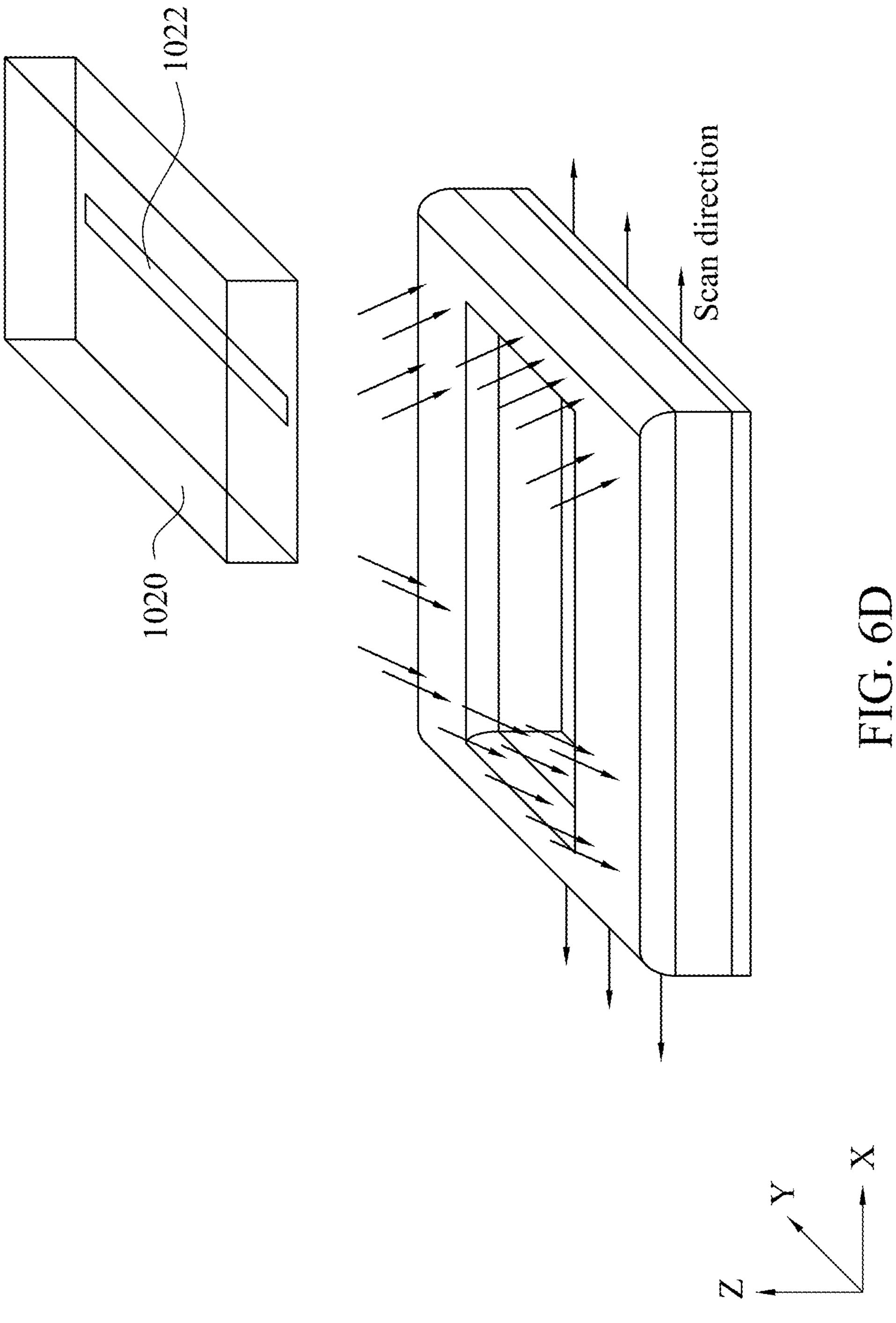

FIG. 6A shows a schematic view of a directional patterning apparatus for performing directional patterning to remove portions of the hard mask layer 404 surrounding the via 412 in the operations illustrated in FIGS. 4F and 4G, in accordance with an embodiment of the present disclosure. FIGS. 6B, 6C and 6D show schematic views of a directional patterning process. It is understood that directional patterning can be similarly performed on the hard mask layer 404.

As shown in FIG. 6A, the directional patterning apparatus, for example, a directional etching apparatus 1000 includes a main chamber 1010 in which a wafer stage 1030 for a wafer to be processed is disposed, and a plasma generation chamber 1020 for generating plasma. In some embodiments, the plasma is RF (radio frequency) generated plasma, using a high frequency power supply at 13.56 MHz and/or 2.45 GHz. Other frequency ranges may be used. A separation plate 1026 is disposed between the main chamber 1010 and the plasma chamber 1020. The separation plate 1026 includes a slit 1022 from which plasma beams 1100 are introduced into the main chamber. In some embodiments, an adjustable meniscus 1024 is provided over the slit 1022 in the plasma chamber side. One or more vacuum systems 1040 including, for example, a turbo molecular pump, is coupled to the main chamber and to the plasma chamber (not shown) to maintain a reduced pressure state in the chambers. In some embodiments, during the etching process, the pressure in the main chamber is lower than the pressure in the plasma chamber. In certain embodiments, the pressure in the main chamber is in the order of $1\times10^{-5}$ Torr, and the pressure in the plasma chamber is in the order of $1\times10^{-3}$ Torr.

In some embodiments, the separation plate 1026 and the wafer stage 1030 are biased by a DC voltage to extract and control the plasma beams 1100. Further, the wafer stage 1030 is movable by a moving mechanism 1035 to scan the wafer relative to the plasma beams 1100.

In some embodiments, at least one of RF and DC bias voltages is tuned to achieve an electric field that causes etching species to flow substantially horizontally along an in-plane direction (for example, in the X direction) relative to a surface over the substrate, or to provide a large incident angle. In some embodiments, the etching species are tuned to have a profile of momenta of the energetic species such that the momenta of the etching species or energetic species along a frontline are not the same, i.e., the momentum of an etching or energetic species on the top path is different from the momentum of an etching or energetic species on the bottom path. In some embodiments, the momentum of an etching or energetic species on the top path is different from the momentum of an etching or energetic species in the middle path above the bottom path, and the momentum of the etching or energetic species on the top path is the same as or different from the momentum of an etching or energetic species on the bottom path. Any combinations can be achieved by adjustment of the electromagnetic control to tune the energies of the etching or energetic species alone the etching front.

In some embodiments, as shown in FIGS. 6B and 6C, a position of the meniscus 1024 is adjusted to change the incident angle θi of the plasma beams 1100. As shown in FIG. 6D, by scanning the wafer along the X direction, a groove pattern can be formed without substantially expanding the groove in the Y direction.

In some embodiments, in the directional etching, a ratio of an amount of etching in the X direction to an amount of etching in the Y direction is about 2 or more, and is about 5 or more in other embodiments. In certain embodiments, the ratio is about 10 or more. Ideally, the ratio is as high as possible, and is up to about 50 in some embodiments and up to about 100 in other embodiments. Further, an amount of etching along the Z direction (vertical direction) is smaller than the amount of etching in the X direction. In some embodiments, a ratio of an amount of etching in the X direction to an amount of etching in the Z direction is about 2 or more, and is about 5 or more in other embodiments. In certain embodiments, the ratio is about 10 or more. Ideally, the ratio is as high as possible, and it is up to about 50 in some embodiments and up to about 10 in other embodiments.

As set forth above, the directional etching is a local etching which is performed on only a partial area of the substrate (wafer). In some embodiments, the width of the etched area corresponds to the width of the slit 1022 along the Y direction shown in FIG. 6D. In some embodiments, the width is in a range from about 5 mm to about 50 mm. The width can be changed by using, for example, a mechanical shutter. The length of the area along the X direction can be adjusted by the adjustable meniscus 1024 as shown in FIGS. 6B and 6C, and is in a range from about 5 mm to about 50 mm in some embodiments. In some embodiments, the etching area has a square shape or a rectangular shape. As a result of the directional etching, wider metal landing margins are formed, as shown in FIGS. 4F and 4G.

Figure 7:
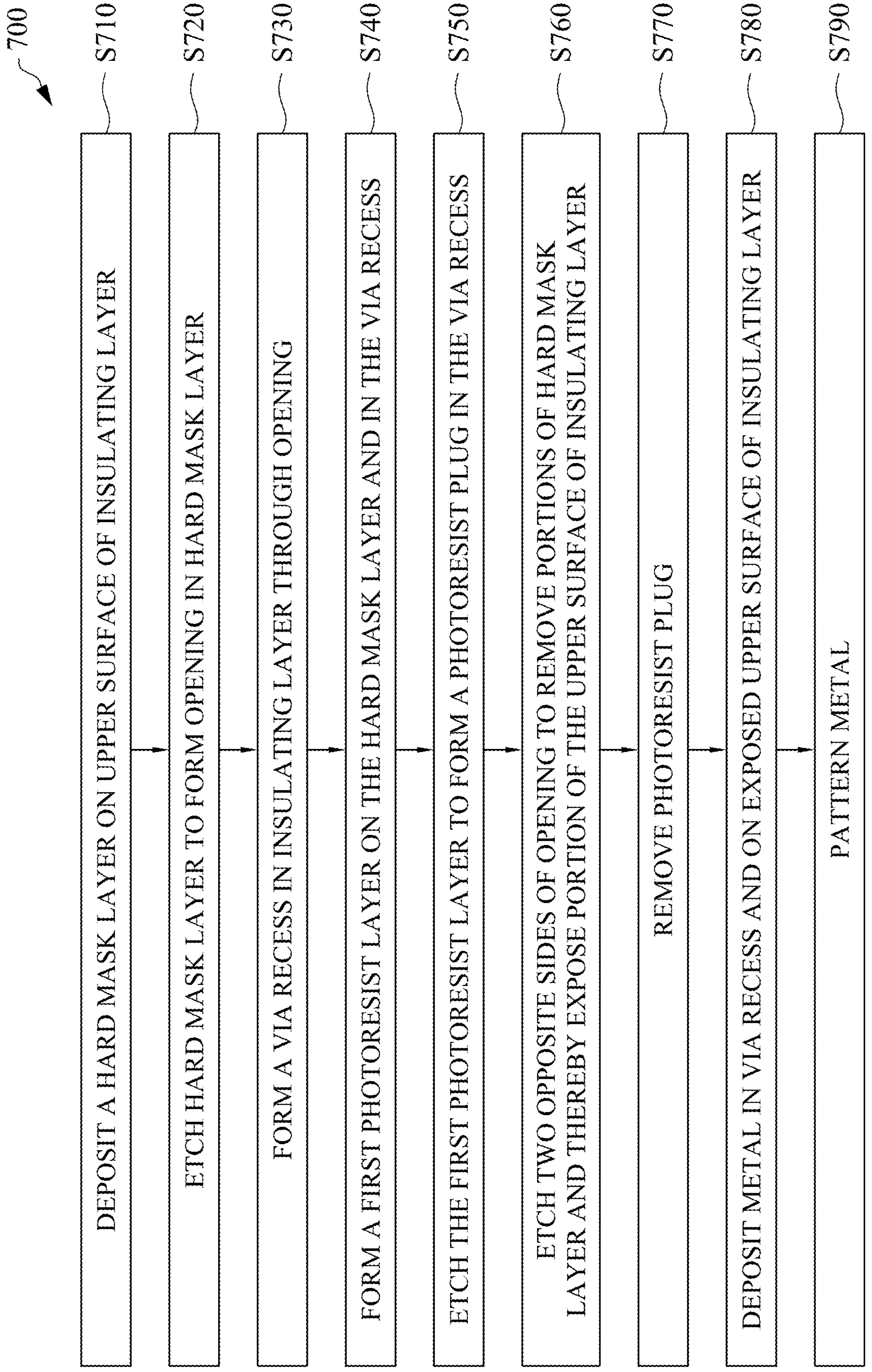
FIG. 7 is a flow chart illustrating a semiconductor manufacturing process according to an embodiment of the present disclosure.

FIG. 7 is a flow chart illustrating a metal etching method 700, according to an embodiment of the present disclosure. It is understood that additional operations can be provided before, during, and after processes discussed in FIG. 7, and some of the operations described below can be replaced or eliminated, for additional embodiments of the method. The order of the operations/processes may be interchangeable and at least some of the operations/processes may be performed in a different sequence. In some embodiments, at least two or more operations/processes are performed overlapping in time, or almost simultaneously.

The method 700 includes an operation S710 of depositing a hard mask layer on an upper surface of an insulating layer. In some embodiments, the insulating layer has a dielectric constant lower than 3.9. In some embodiments, the insulating layer is an inter-metal dielectric (IMD) layer. In operation S720, the hard mask layer is etched to from an opening in the hard mask layer. In operation S730, a via is formed in the insulating layer through the opening. In some embodiments, a directional patterning operation is used to etch portions of the hard mask surrounding the via. In operation S740, a first photoresist layer is formed on the hard mask layer and in the via recess. In operation S750, the first photoresist layer is etched to form a photoresist plug in the via recess. In operation S760, two opposite sides of the opening are etched to remove portions of the hard mask layer and thereby expose a portion of the upper surface of the insulating layer. In operation S770, the photoresist plug is removed. In operation S780, metal is deposited in the via recess and on the exposed surface of the insulating layer. In operation S790, the metal is patterned.

Figure 8A:
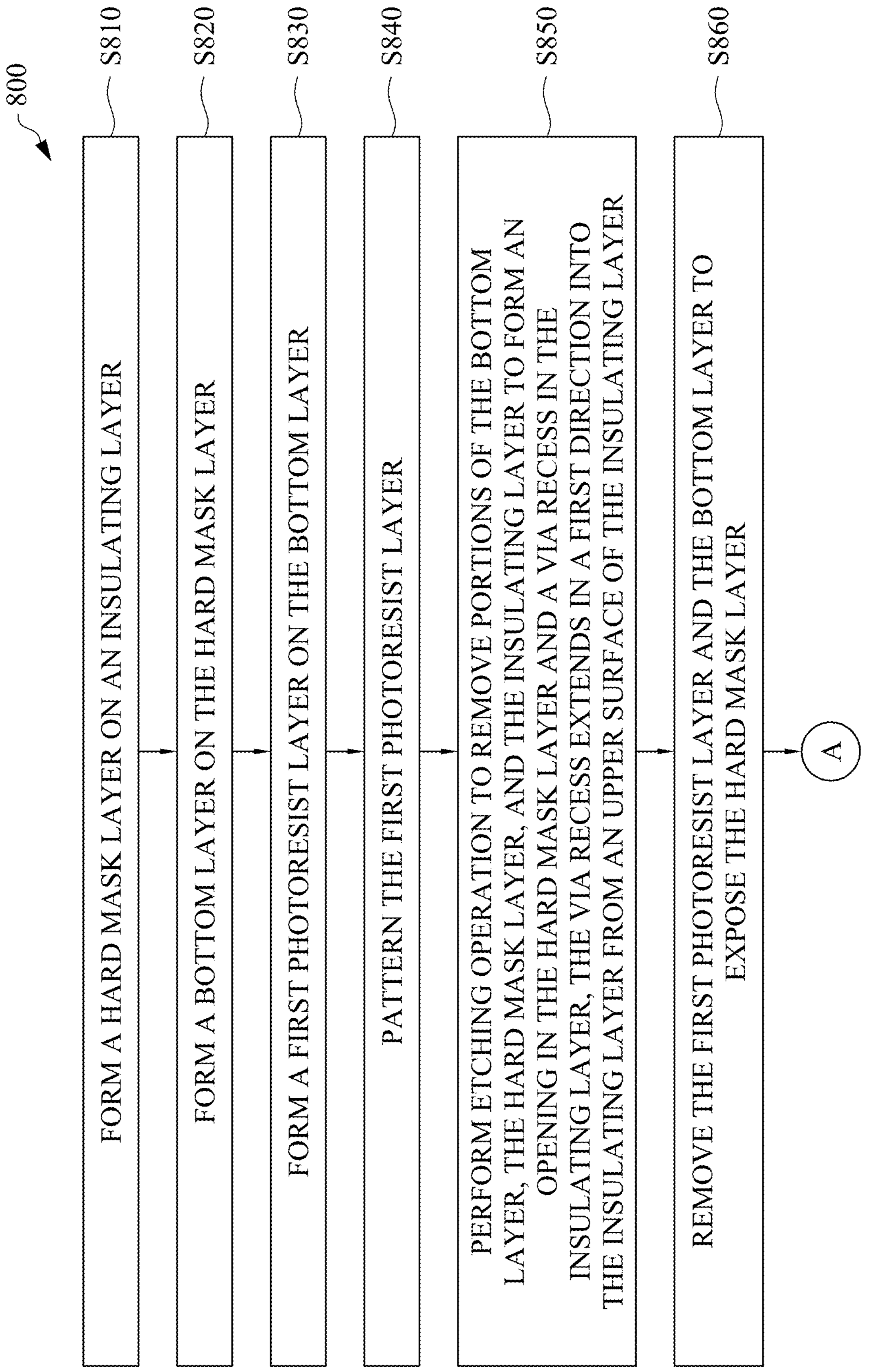
FIGS. 8A and 8B are a flow chart illustrating a semiconductor manufacturing process according to an embodiment of the present disclosure.
Figure 8B:
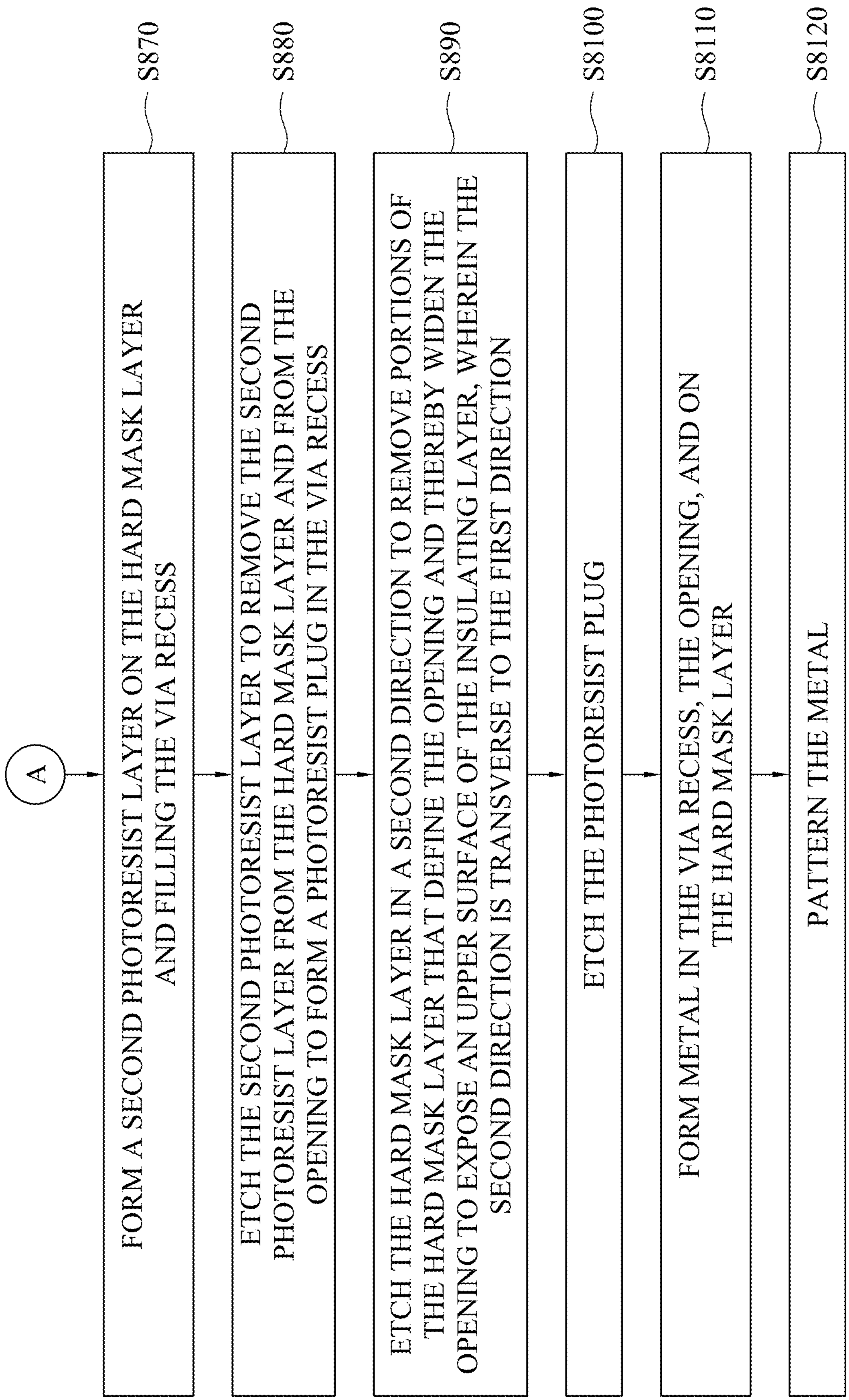

FIGS. 8A and 8B are a flow chart illustrating a metal etching process 800, according to an embodiment of the present disclosure. It is understood that additional operations can be provided before, during, and after processes discussed in FIGS. 8A and 8B, and some of the operations described below can be replaced or eliminated, for additional embodiments of the method. The order of the operations/processes may be interchangeable and at least some of the operations/processes may be performed in a different sequence. In some embodiments, at least two or more operations/processes are performed overlapping in time, or almost simultaneously.

The method includes an operation S810 of forming a hard mask layer on an insulating layer. In some embodiments, the insulating layer has a dielectric constant lower than 3.9. In some embodiments, the insulating layer is an inter-metal dielectric (IMD) layer. In operation S820, a bottom layer is formed on the hard mask layer. In operation S830, a first photoresist layer is formed on the bottom layer. In operation S840, the first photoresist layer is patterned. In operation S850, an etching operation is performed to remove portions of the bottom layer, the hard mask layer, and the insulating layer to form an opening in the hard mask layer and a via recess in the insulating layer. The via recess extends in a first direction into the insulating layer from an upper surface of the insulating layer. In operation S860, the first photoresist layer and the bottom layer are removed to expose the hard mask. In operation S870, a second photoresist layer is formed on the hard mask layer and filling the via recess. In operation S880, the second photoresist layer is etched to remove the second photoresist layer from the hard mask layer and from the opening to form a photoresist plug in the via recess. In operation S890, the hard mask layer is etched in a second direction to remove portions of the hard mask layer that define the opening and to widen the opening to expose the upper surface of the insulating layer. The second direction is transverse to the first direction. In some embodiments, a directional patterning operation is used to etch portions of the hard mask layer. In operation S8100, the photoresist plug is etched. In operation S8110, a metal is formed in the via recess, the opening, and on the hard mask. In operation S8120, the metal is patterned.

Figure 9:
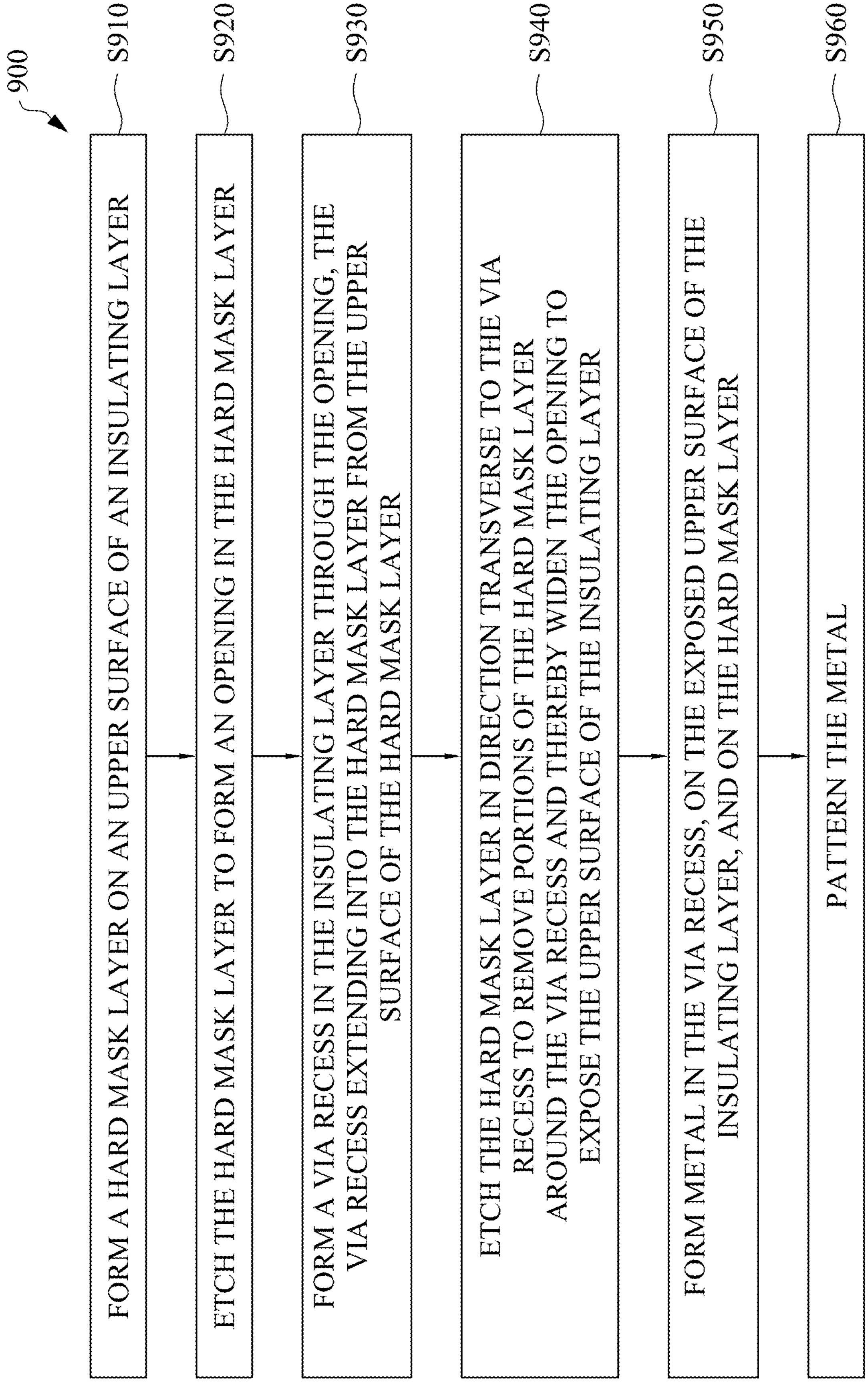
FIG. 9 is a flow chart illustrating a semiconductor manufacturing process according to an embodiment of the present disclosure.

FIG. 9 is a flow chart illustrating a metal etching process 900, according to an embodiment of the present disclosure. It is understood that additional operations can be provided before, during, and after processes discussed in FIG. 9, and some of the operations described below can be replaced or eliminated, for additional embodiments of the method. The order of the operations/processes may be interchangeable and at least some of the operations/processes may be performed in a different sequence. In some embodiments, at least two or more operations/processes are performed overlapping in time, or almost simultaneously.

The method includes an operation S910 of forming a hard mask layer on an upper surface of an insulating layer. In some embodiments, the insulating layer has a dielectric constant lower than 3.9. In some embodiments, the insulating layer is an inter-metal dielectric (IMD) layer. In operation S920, the hard mask layer is etched to form an opening in the hard mask layer. In operation, S930, a via recess is formed in the insulating layer through the opening. The via recess extends into the hard mask layer from an upper surface of the hard mask layer. In operation S940, the hard mask layer is etched in a direction transverse to the via recess to remove portions of the hard mask layer around the via recess and thereby widen the opening to expose the upper surface of the insulating layer. In operation S950, metal is formed in the via recess, on the exposed upper surface of the insulating layer, and on the hard mask layer. In operation S960, the metal is patterned.

The method according to example embodiments disclosed herein provides numerous advantages. By providing wider metal landing margins, error margin in overlay control is increased and the formation of pits or voids in the via recess is reduced. As a result, short circuits and connection failures are reduced and fab yield and profit margins are improved.

An embodiment of the disclosure is a method for manufacturing a semiconductor device, including depositing a hard mask layer on an upper surface of an insulating layer. The hard mask layer is etched to form an opening in the hard mask layer. A via recess is formed in the insulating layer through the opening. A first photoresist layer is formed on the hard mask layer and in the via recess. The first photoresist layer is etched to form a photoresist plug in the via recess. Two opposite sides of the opening are etched to remove portions of the hard mask layer and thereby a portion of the upper surface of the insulating layer is exposed. The photoresist plug is removed. Metal is deposited in the via recess and on the exposed surface of the insulating layer. The metal is patterned. In an embodiment, prior to etching the hard mask layer, a bottom layer is formed on the hard mask layer, a second photoresist layer is formed on the bottom layer, and portions of the bottom layer and second photoresist layer are removed to expose the hard mask layer. In an embodiment, the via recess is formed extending from an upper surface of the hard mask layer into the insulating layer, and portions of the hard mask layer are etched in a direction transverse to the via recess. In an embodiment, sides of the opening other than the two opposite sides are etched to remove portions of the hard mask layer. In an embodiment, the two opposite sides of the opening include a first side and a second side opposite the first side, and the first side and second side are etched sequentially using a directional patterning operation. In an embodiment, the insulating layer is an inter-metal dielectric (IMD) layer.

Another embodiment of the disclosure is a method for manufacturing a semiconductor device that includes forming a hard mask layer on an insulating layer. A bottom layer is formed on the hard mask layer. A first photoresist layer is formed on the bottom layer. The first photoresist layer is patterned. An etching operation is performed to remove portions of the bottom layer, the hard mask layer, and the insulating layer to form an opening in the hard mask layer and a via recess in the insulating layer. The via recess extends in a first direction into the insulating layer from an upper surface of the insulating layer. The first photoresist layer and the bottom layer are removed to expose the hard mask layer. A second photoresist layer is formed on the hard mask layer and filling the via recess. The second photoresist layer is etched to remove the second photoresist layer from the hard mask layer and from the opening to form a photoresist plug in the via recess. The hard mask layer is etched in a second direction to remove portions of the hard mask layer that define the opening and the opening is thereby widened to expose the upper surface of the insulating layer. The second direction is transverse to the first direction. The photoresist plug is etched. A metal is formed in the via recess, the opening, and on the hard mask layer, and the metal is patterned. In an embodiment, widening the opening removes a portion of the hard mask layer surrounding the via recess such that sidewalls of the opening are spaced apart from an edge of the via recess and the upper surface of the insulating layer is exposed. In an embodiment, the hard mask layer the hard mask layer has a thickness of about 20 Å to about 3000 Å. In an embodiment, the hard mask layer is etched in the second direction such that the opening has an oval shape in a plan view. In an embodiment, the metal in the opening has an oval shape. In an embodiment, the metal forms at least a part of a metal interconnect of the semiconductor device.

Yet another embodiment of the disclosure is a semiconductor device that includes an insulating layer, a via recess in the insulating layer, a hard mask layer over an upper surface of the insulating layer and having an opening over the via recess such that portions of the upper surface of the insulating layer are exposed via the opening, metal formed in the via recess, in the opening, and on the exposed upper surface of the insulating layer, and a metal line over the via recess and in contact with the metal in the opening. An axis of the metal line is offset from the center of the via recess. In an embodiment, the opening has an oval shape in a plan view of the semiconductor device. In an embodiment, the metal in the opening has an oval shape. In an embodiment, the via recess extends in a first direction into the insulating layer from an upper surface of the insulating layer and the metal line extends longitudinally in a second direction transverse to the first direction. In an embodiment, the metal line forms at least a part of a metal interconnect of the semiconductor device. In an embodiment, the hard mask layer has a thickness of about 20 Å to about 3000 Å. In an embodiment, the insulating layer is an inter-metal dielectric (IMD) layer. In an embodiment, sidewalls of the opening are spaced from an opening of the via recess in the insulating layer by about a same distance.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:

forming a hard mask layer over an insulating layer;

etching the hard mask layer and the insulating layer to form a trench and a via recess;

further etching the hard mask layer to form a landing margin having exposed portions of an upper surface of the insulating layer surrounding a periphery of the via recess;

depositing an electrically conductive material over the trench, the via recess, and the landing margin; and patterning the electrically conductive material to form a conductive line.

2. The method of claim 1, wherein etching the hard mask layer further comprises performing a directional patterning operation such that the landing margin has an oval shape in a plan view.

3. The method of claim 2, wherein depositing the electrically conductive material further comprises filling the landing margin such that the electrically conductive material has the oval shape within the landing margin.

4. The method of claim 1, wherein:

a via is formed by the electrically conductive material that fills the via recess and the via extends in a first direction into the insulating layer;

the conductive line extends longitudinally within the trench in a second direction that is perpendicular to the first direction; and the via and the conductive line are electrically connected to one another.

5. The method of claim 1, wherein the conductive line comprises a metal such that the conductive line forms at least a part of a metal interconnect of the semiconductor device.

6. The method of claim 1, wherein forming the hard mask layer comprises depositing the hard mask layer over the insulating layer such that the hard mask layer comprises a thickness between 20 Å and 3000 Å.

7. The method of claim 1, further comprising forming the insulating layer as an inter-metal dielectric (IMD).

8. The method of claim 1, wherein further etching the hard mask layer to form the landing margin further comprises etching the hard mask layer such that a first sidewall and a second sidewall of the landing margin are spaced apart from respective sidewalls of the via recess by equal amounts.

9. The method of claim 1, wherein further etching the hard mask layer to form the landing margin further comprises etching the hard mask layer such that a first sidewall and a second sidewall of the landing margin are spaced apart from respective sidewalls of the via recess by different distances.

10. A method of forming a semiconductor device, comprising:

patterning an insulating layer to form a trench extending along a first direction and a via recess extending into the insulating layer in a second direction that is perpendicular to the first direction;

further patterning a top portion of the insulating layer around the via recess to form a landing margin;

depositing a metal over the trench, the via recess, and the landing margin;

forming a patterned mask over the metal located over at least a portion of the via recess and the landing margin; and patterning the metal.

11. The method of claim 10, further comprising:

forming the insulating layer as a multi-layer structure comprising a hard mask layer formed over an inter-metal dielectric (IMD) layer, wherein patterning the top portion of the insulating layer further comprises performing a directional patterning operation to pattern the hard mask layer.

12. The method of claim 11, wherein performing the directional patterning operation further comprises etching the top portion of the insulating layer such that the landing margin has an oval shape in a plan view.

13. The method of claim 12, wherein depositing the metal further comprises filling the landing margin such that the metal has the oval shape within the landing margin.

14. The method of claim 12, wherein two opposite sides of the landing margin include a first side and a second side opposite the first side, and etching the hard mask layer further comprises sequentially etching the first side and the second side using a directional patterning operation.

15. The method of claim 14, wherein performing the directional patterning operation further comprises:

etching the hard mask layer along the second direction and along a third direction that is perpendicular to the first direction and the second direction, wherein a first amount of material removed along the third direction is greater than a second amount of material removed along the second direction.

16. The method of claim 15, wherein a ratio of an amount of etching along the third direction to that along the second direction is between 2 and 100.

17. A method of manufacturing a semiconductor device, comprising:

etching a via recess in an insulating layer;

etching an opening in a top portion of the insulating layer laterally surrounding a periphery of the via recess comprising a landing margin having exposed portions of a surface of the insulating layer, wherein the opening comprises an asymmetric shape having a first width that is less than a second width; and depositing an electrically conductive material in the via recess and over the landing margin within the opening and over the exposed portions of the surface of the insulating layer.

18. The method of claim 17, wherein etching the opening further comprises performing a directional patterning operation such that the landing margin has an oval shape in a plan view.

19. The method of claim 17, further comprising:

etching a trench in the insulating layer; and depositing the electrically conductive material in the trench and the via recess, thereby forming an interconnect line that is electrically connected to a via, the via extending in a first direction into the insulating layer, wherein the interconnect line extends longitudinally within the trench in a second direction that is perpendicular to the first direction.

20. The method of claim 19, wherein the first width is along the second direction and the second width is along a third direction that is perpendicular to the first direction and the second direction, and a ratio of the second width to the first width is between 2 and 100.

* * * * *